United States Patent
Kim

(10) Patent No.: US 10,763,311 B2
(45) Date of Patent: Sep. 1, 2020

(54) ORGANIC LIGHT EMITTING DISPLAY DEVICE

(71) Applicant: LG Display Co., Ltd., Seoul (KR)

(72) Inventor: Hanhee Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/706,359

(22) Filed: Dec. 6, 2019

(65) Prior Publication Data
US 2020/0194513 A1 Jun. 18, 2020

(30) Foreign Application Priority Data

Dec. 12, 2018 (KR) ........................ 10-2018-0160031

(51) Int. Cl.
*H01L 51/00* (2006.01)
*H01L 27/32* (2006.01)
*H01L 51/50* (2006.01)

(52) U.S. Cl.
CPC ...... *H01L 27/3218* (2013.01); *H01L 27/3246* (2013.01); *H01L 51/5056* (2013.01); *H01L 51/5072* (2013.01); *H01L 51/5092* (2013.01)

(58) Field of Classification Search
CPC ............. H01L 27/3246; H01L 27/3258; H01L 51/5203; H01L 51/5209; H05B 33/08; H05B 33/10; H05B 33/20; H05B 33/22; H05B 33/26
See application file for complete search history.

(56) References Cited

U.S. PATENT DOCUMENTS

2002/0158835 A1* 10/2002 Kobayashi .......... H01L 51/5218
  345/100
2014/0312319 A1* 10/2014 Kim .................... H01L 27/3258
  257/40

* cited by examiner

*Primary Examiner* — Robert G Bachner
(74) *Attorney, Agent, or Firm* — Polsinelli PC

(57) ABSTRACT

An organic light emitting display device comprises a substrate having a plurality of sub-pixels arranged in a first direction and a second direction intersecting the first direction; a plurality of first electrodes disposed to correspond to the plurality of sub-pixels; a first bank having a plurality of first openings exposing a portion of the plurality of first electrodes; and a second bank disposed on the first bank, having a plurality of second openings that exposes the plurality of first electrodes, and at least one third opening disposed between two neighboring second openings along the second direction.

20 Claims, 18 Drawing Sheets

— 1st Bank Boundary

— 1st Bank Boundary
— 2nd Bank Boundary

ORGANIC LIGHT EMITTING DISPLAY DEVICE

CROSS REFERENCE TO RELATED APPLICATION

This application claims the priority benefit of Korean Patent Application No. 10-2018-0160031 filed on Dec. 12, 2018, which is hereby incorporated by reference in its entirety.

BACKGROUND

Field of the Disclosure

The present disclosure relates to a display device, and more particularly, to an organic light emitting display device. Although the present disclosure is suitable for a wide scope of applications, it is particularly suitable for improving deterioration in display quality caused by non-uniform thickness in an organic emission layer of the organic light emitting display device.

Description of the Background

Various display devices which are light and compact and thus can supplement the weakness of cathode ray tubes have been developed. Such display devices include a liquid crystal display (LCD), a plasma display panel (PDP), a field emission display (FED) and an organic light emitting display device, etc.

The organic light emitting display devices are spontaneous emission devices and have advantages of fast response time, high emission efficiency, high luminance and wide viewing angles. Further, flexible display devices can be realized because elements can be formed on a flexible substrate such as a plastic substrate.

As large-area high-definition organic light emitting display devices are required, a single panel includes a plurality of sub-pixels. A mask is used for pattering of red, green and blue sub-pixels, in general. Accordingly, to realize large-area display devices, a large-area fine metal mask (FMM) corresponding to the plurality of sub-pixels is needed. However, a mask can be bent as the area thereof increases to causes various problems such as deposition of an organic light-emitting material forming an emission layer at unintended locations.

To solve such problems in a deposition method using the aforementioned mask, a solution process which is simple and suitable for large areas attracts interest. The solution process can be performed for large-area patterning through inkjet printing or nozzle printing without a mask and has a very high material use rate of about 50 to 80% compared to evaporation having a material use rate of less than 10%. In addition, the solution process has a higher glass transition temperature than evaporation and thus can provide high thermal stability and morphology property.

However, when an emission layer is formed through the solution process, a thickness deviation can be caused depending upon the position in sub-pixels and can eventfully cause non-uniform thickness in the emission layer that leads to considerable deterioration of display quality.

SUMMARY

Accordingly, the present disclosure is directed to an organic light emitting display device that substantially obviates one or more of problems due to limitations and disadvantages of the prior art.

More specifically, the present disclosure provides an organic light emitting display device capable of improving display quality deterioration due to a thickness deviation in an organic emission layer.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

An organic light emitting display device according to the present disclosure includes a substrate, first electrodes, a first bank, and a second bank. The substrate has a plurality of sub-pixels arranged in a first direction and a second direction intersecting the first direction. The first electrodes are respectively allocated to the sub-pixels. The first bank has first openings for exposing the first electrodes. The second bank is disposed on the first bank and includes second openings and at least one third opening. The second openings expose of the first electrodes. The third opening is disposed between second openings neighboring in the second direction in a predetermined area.

BRIEF DESCRIPTION OF THE DRAWINGS

The accompanying drawings, which are included to provide a further understanding of the disclosure and are incorporated in and constitute a part of this disclosure, illustrate aspects of the disclosure and together with the description serve to explain the principles of the disclosure.

In the drawings.

DETAILED DESCRIPTION

Hereinafter, the present disclosure will be described in detail through aspects with reference to the accompanying drawings. The same reference numbers will be used throughout this specification to refer to the same or like parts. In the following description of the present disclosure, a detailed description of known functions and configurations incorporated herein will be omitted when it may obscure the subject matter of the present disclosure. In description of various aspects, the same components may be representatively described at the beginning and omitted in other aspects.

In the following description of the aspects, "first" and "second" are used to describe various components, but such components are not limited by these terms. The terms are used to discriminate one component from another component.

Figure 1:
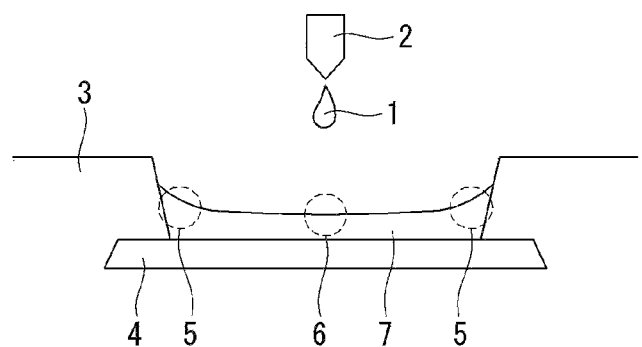
FIG. 1 is a schematic view for describing problems in a solution process.

FIG. 1 is a schematic view for describing problems in a solution process.

Referring to FIG. 1, when an organic emission layer is formed using the solution process (or soluble process), pile up may occur and deteriorate the emission characteristic of an organic light emitting display device. More specifically, an organic light-emitting material 1 may be dropped on a first electrode 4 defined by a bank 3 through an inkjet apparatus 2. The dropped organic light-emitting material 1 has a thickness deviation according to positions due to a hardening rate difference in the hardening process. That is, an organic emission layer 7 having a thick edge 5 in contact with the bank and a thin center 6 can be formed.

When the organic emission layer 7 having an ununiform thickness is formed in this manner, a luminance deviation according to positions may occur to deteriorate display quality. Furthermore, a current density difference may be generated in the organic emission layer 7 to cause decrease in the lifespans of elements or dark spots may be generated to decrease process yield. Accordingly, it is necessary to minimize an area in which pile up occurs in formation of an emission layer formed by the solution process.

Figure 2:
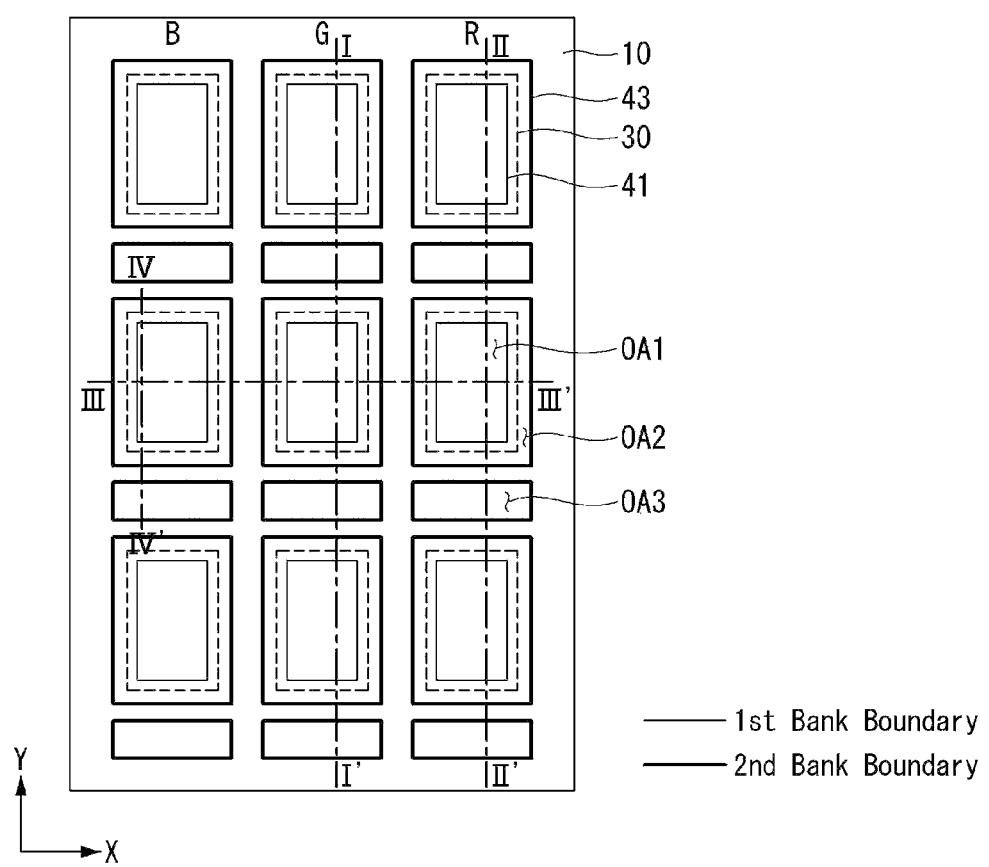
FIG. 2 is a schematic plan view showing an organic light emitting display device according to a first aspect of the present disclosure.
Figure 3:
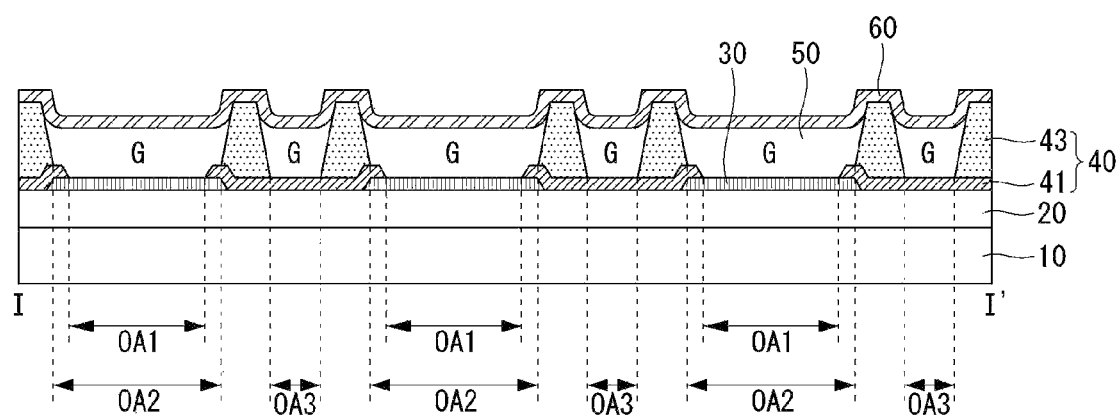
FIG. 3 is a cross-sectional view taken along line I-I' of FIG. 2.
Figure 4:
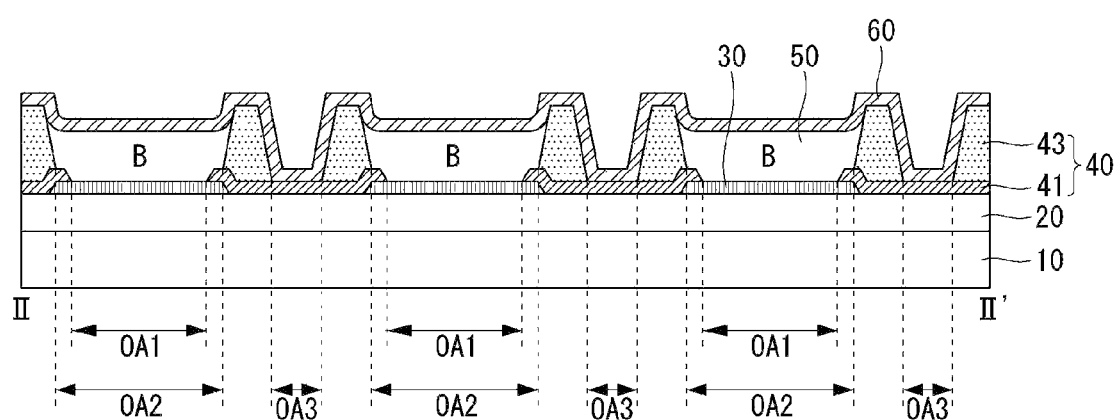
FIG. 4 is a cross-sectional view taken along line II-II' of FIG. 2.
Figure 5:
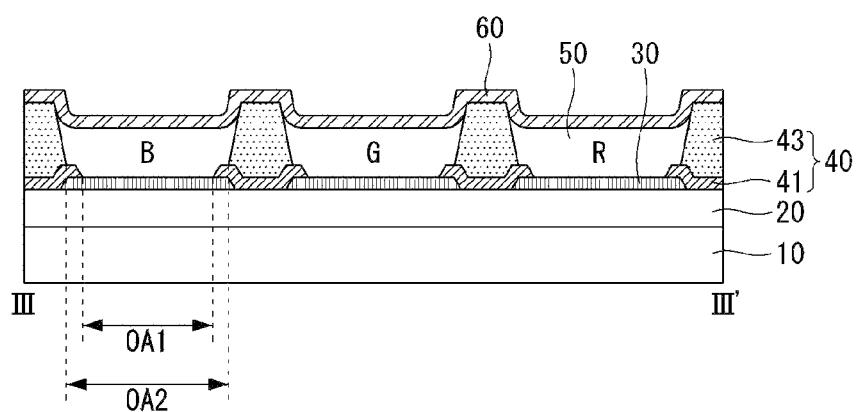
FIG. 5 is a cross-sectional view taken along line III-III' of FIG. 2.
Figure 6A:
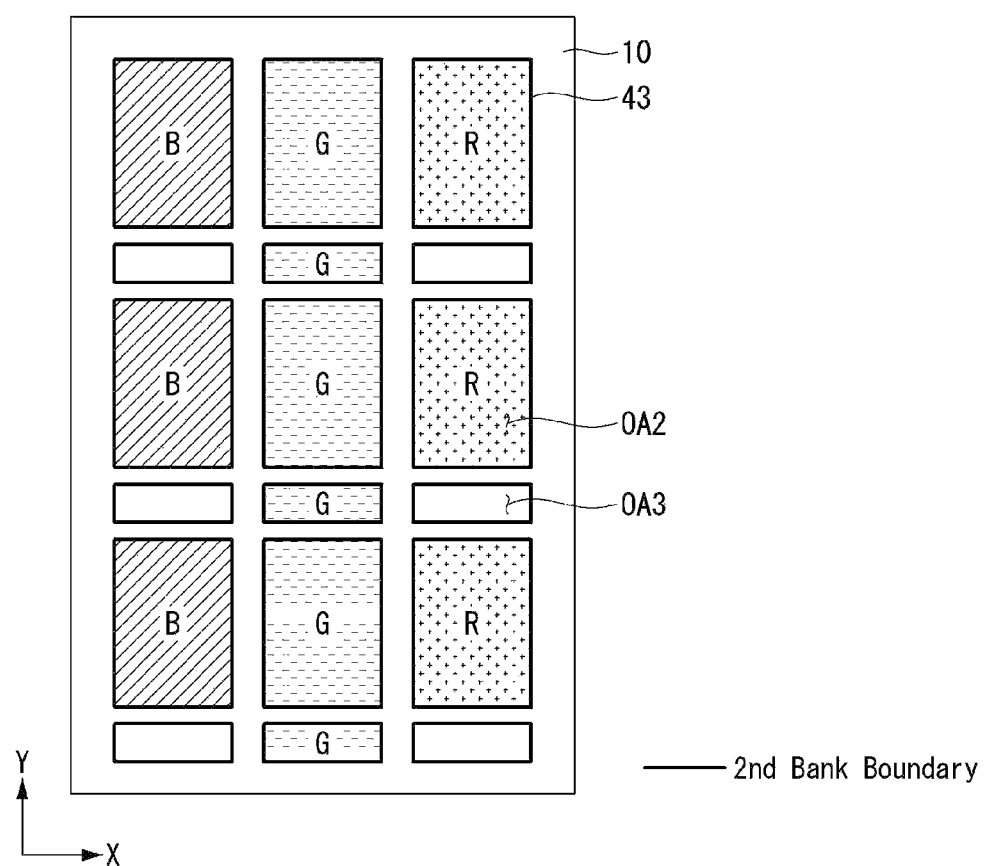
FIGS. 6A and 6B are schematic views for describing examples of arrangement of organic emission layers.
Figure 6B:
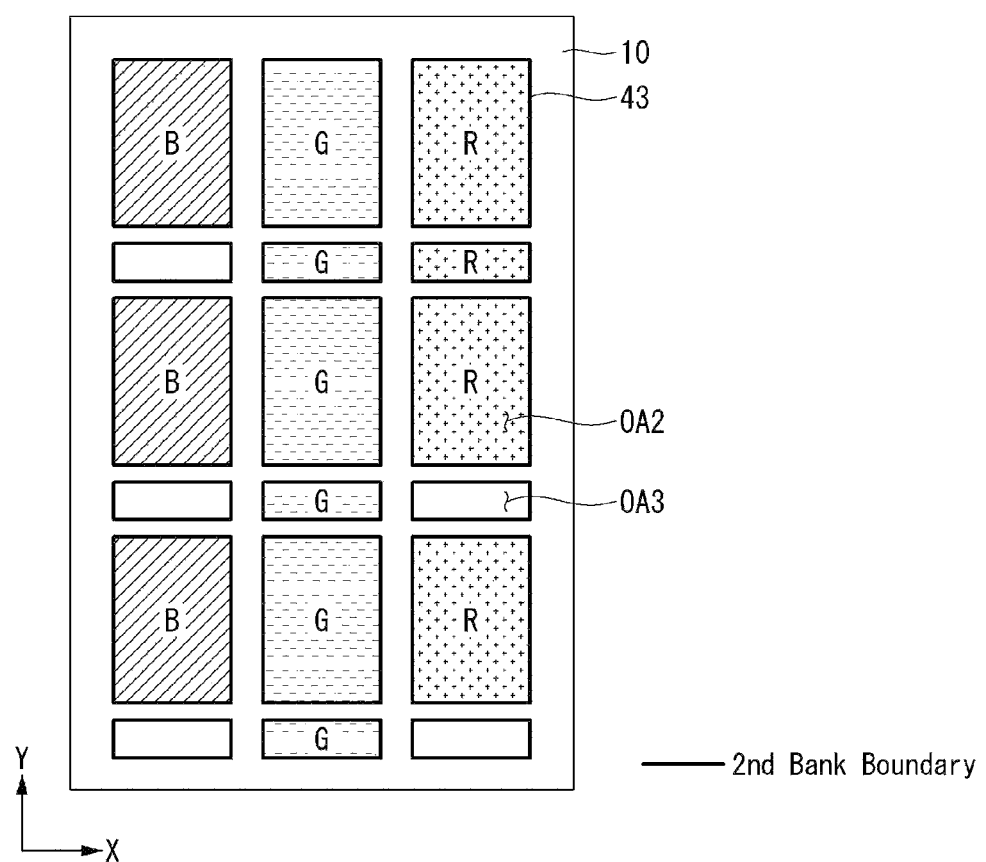
Figure 7:
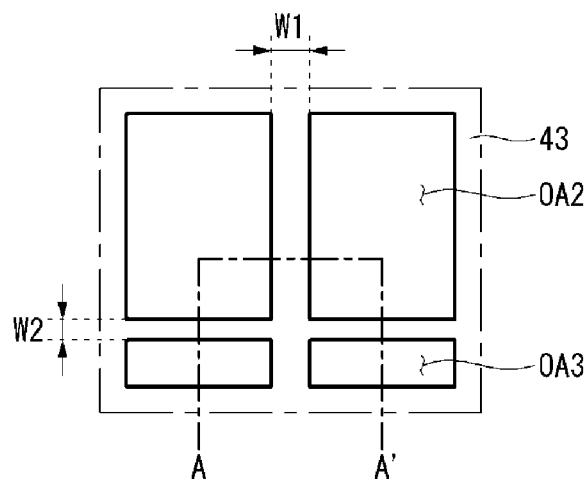
FIG. 7 is a schematic view for describing a width difference of a second bank according to positions and effects thereof.
Figure 7:
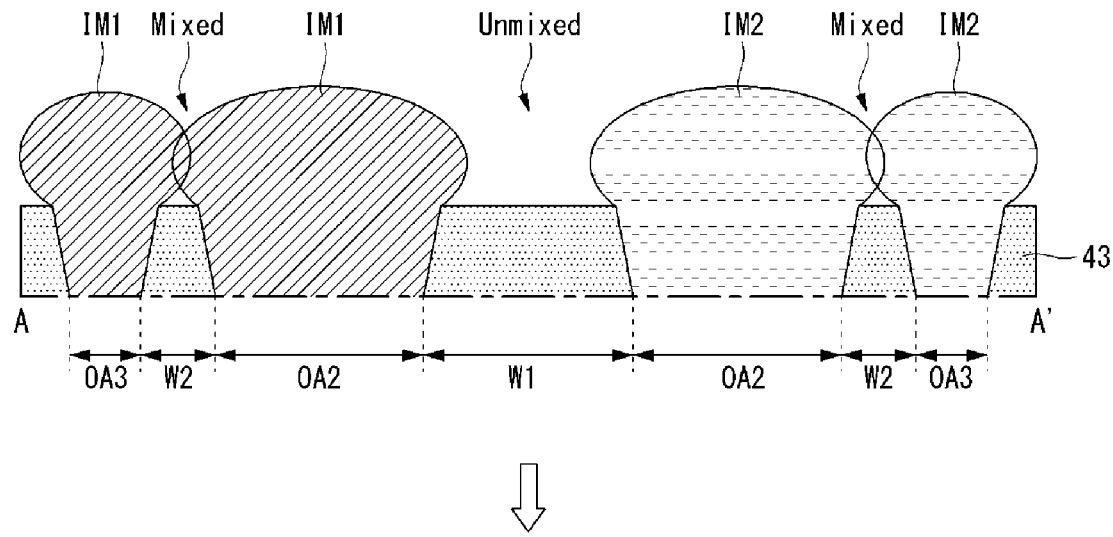
Figure 7:
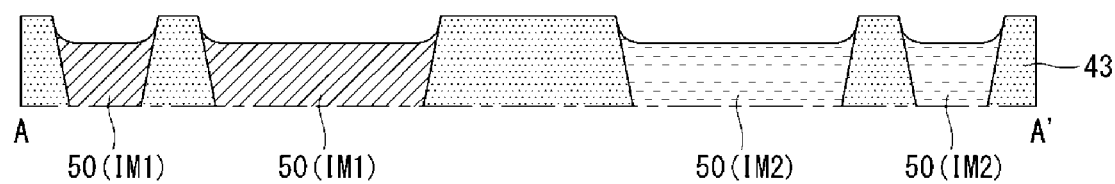

FIG. 2 is a schematic plan view showing an organic light emitting display device according to a first aspect of the present disclosure. FIG. 3 is a cross-sectional view taken along line I-I' of FIG. 2. FIG. 4 is a cross-sectional view taken along line II-II' of FIG. 2. FIG. 5 is a cross-sectional view taken along line III-III' of FIG. 2. FIGS. 6A and 6B are schematic views for describing examples of arrangement of organic emission layers. FIG. 7 is a schematic view for describing a width difference of a second bank according to positions and effects thereof.

Referring to FIGS. 2 to 5, the organic light emitting display device according to the first aspect includes a substrate 10 on which sub-pixels SP are arranged. A circuit element layer 20 and organic light-emitting diodes (OLEDs) driven by elements included in the circuit element layer 20 are arranged on the substrate 10.

The circuit element layer 20 may include signal lines and electrodes arranged therein, through which driving signals are applied to the OLEDs, and the signal lines and the electrodes may be separately disposed having at least one insulating layer interposed therebetween as necessary. When the organic light emitting display device is realized as an active matrix (AM) type, the circuit element layer 20 may further include transistors allocated per sub-pixel SP. Transistors may be realized in various structures such as top gate, bottom gate and double gate structures. Further, transistors may be realized as p-type or n-type transistors. A semiconductor layer forming transistors may include amorphous silicon, polysilicon or an oxide. Hereinafter, an OLED and a bank structure will be described first and then a specific transistor arrangement example will be described.

An OLED includes a first electrode 30, a second electrode 60, and an organic emission layer 50 interposed between the first electrode 30 and the second electrode 60. The first electrode 30 may be an anode and the second electrode 60 may be a cathode.

More specifically, sub-pixels SP may be arranged in a first direction (e.g., the X-axis direction) and a second direction (e.g., the Y-axis direction) which intersect each other. Sub-pixels SP consecutively disposed in the first direction may emit lights in different colors and sub-pixels SP consecutively disposed in the second direction may emit lights in the same color. The first electrodes 30 of OLEDs are disposed in the sub-pixels SP. One first electrode 30 can be allocated to each sub-pixel SP.

A bank 40 is disposed on the first electrodes 30. The bank 40 includes a first bank 41 and a second bank 43.

The first bank 41 is disposed on the first electrodes 30. The first bank 41 includes first openings OA1. The first opening OA1 exposes at least portions of the first electrodes 30. One first opening OA1 exposes one first electrode 30. Accordingly, the number of first openings OA1 can correspond to the number of first electrodes 30.

The first bank 41 may be formed relatively thin such that it can be covered by the organic emission layer 50. The first bank 41 may have hydrophilicity. For example, the first bank 41 may be formed of a hydrophilic inorganic insulating material such as silicon oxide ($SiO_2$) or silicon nitride ($SiN_x$).

Although the figures show an example in which the first openings OA1 have an approximately rectangular shape, the present disclosure is not limited thereto. Further, although the figures show that all the first openings OA1 have the same shape and area, the present disclosure is not limited thereto and at least one first opening OA1 may have a shape and/or an area different from those of another first opening OA1. For example, shapes and/or areas of the first openings OA1 may be appropriately selected in consideration of the lifespan of an organic light-emitting material for forming the organic emission layer 50 of the OLED. Parts of the first electrodes 30 exposed through the first openings OA1 can be defined as emission regions.

The second bank 43 is disposed on the substrate 10 on which the first bank 41 is formed. The second bank 43 includes second openings OA2 and third openings OA3.

The second opening OA2 exposes at least parts of the first electrode 30. For example, the second openings OA2 may expose parts of the first bank 41. One second opening OA2 exposes one first electrode 30. Accordingly, the number of second openings OA2 can correspond to the number of first electrodes 30.

The third openings OA3 are disposed between first electrodes 30 neighboring in the second direction in at least one area. Alternatively, the third openings OA3 are disposed between first openings OA1 neighboring in the second direction in at least one area. Further, the third openings OA3 are disposed between second openings OA2 neighboring in the second direction in at least one area. The third opening OA3 exposes at least parts of the first bank 41. Regions defined by the third openings OA3 correspond to non-emission regions. Although the figures show a case in which the third openings OA3 are disposed between first electrodes 30 neighboring in the second direction as an example, the present disclosure is not limited thereto and the third openings OA3 may be selected to be disposed in specific areas (or predetermined area).

The second bank 43 may have hydrophobicity. For example, the second bank 43 may have a structure in which a hydrophobic material is coated on an organic insulating material and may be formed of an organic insulating material containing a hydrophobic material. According to the hydrophobicity of the second bank 43, the organic light-emitting material forming the organic emission layer 50 can concentrate on the centers of the emission regions. Further, the second bank 43 can serve as a barrier for confining organic light-emitting materials dropped to corresponding regions in the regions such that organic light-emitting materials having different colors can be prevented from being mixed.

Although the figures show that the second openings OA2 have an approximately rectangular shape as an example, the present disclosure is not limited thereto. In addition, although the figures show that all the second openings OA2 have the same shape and area, the present disclosure is not limited thereto and at least one second opening OA2 may have a shape and/or an area different from those of another second opening OA2. For example, shapes and/or areas of the second openings OA2 may be appropriately selected in consideration of the lifespan of an organic light-emitting material.

Although the figures show that the third openings OA3 have an approximately rectangular shape as an example, the present disclosure is not limited thereto. In addition, although the figures show that all the third openings OA3 have the same shape and area, the present disclosure is not limited thereto and at least one third opening OA3 may have a shape and/or an area different from those of another third opening OA3.

The organic emission layer 50 is positioned on the substrate 10 on which the second bank 43 is formed. The organic emission layer 50 may be formed in corresponding second openings OA2. Organic light-emitting materials emitting lights in different colors may be dropped to second openings OA2 consecutively disposed in the first direction. The organic light-emitting materials emitting lights in different colors may be sequentially alternately dropped to second openings OA2 neighboring in the first direction. The organic light-emitting materials emitting lights in different colors may include organic light-emitting materials emitting red, green and blue lights and may further include an organic light-emitting material emitting white light as necessary. Organic light-emitting materials emitting lights in the same color may be dropped to second openings OA2 consecutively disposed in the second direction.

An organic light-emitting material used to form the organic emission layer 50 may be dropped to cover at least a part of the first electrode 30, a part of the first bank 41 and a part of the second bank 43 in a solution process. The first bank 41 is a hydrophilic thin film provided in order to prevent poor wettability of the first electrodes 30 due to hydrophobicity thereof and allows a hydrophilic organic light-emitting material to well spread. The second bank 43 is a hydrophobic thick film and causes a hydrophilic organic light-emitting material to concentrate on the center. The organic emission layer 50 can be formed to a uniform thickness in the second openings OA2 according to a combination structure of the first bank 41 and the second bank 43.

The organic emission layer 50 may be selectively formed in at least one third opening OA3 according to the position. The organic emission layer 50 may be formed in a third opening OA3 disposed in at least one area. An organic light-emitting material dropped to a third opening OA3 may be a material emitting light in the same color as an organic light-emitting material dropped to a second opening OA2 neighboring the third opening OA3 in the second direction.

For example, referring to FIG. 6A, an organic emission layer emitting green light may be formed in second openings OA2 and third openings OA3 in the second column extending in the second direction. An organic emission layer emitting blue light may be formed in second openings OA2 in the third column extending in the second direction and any organic emission layer may not be formed in third openings OA3 in the third column extending in the second direction.

As another example, referring to FIG. 6B, an organic emission layer emitting green light may be formed in second openings OA2 and third openings OA3 in the second column extending in the second direction. An organic emission layer emitting blue light may be formed in second openings OA2 in the third column extending in the second direction, and an organic emission layer may be selectively formed only in third openings OA3 disposed in at least one area among third openings OA3 in the third column extending in the second direction. That is, a third opening OA3 in which an organic emission layer is formed and a third opening OA3 in which an organic emission layer is not formed may coexist in the same column.

Further referring to FIG. 7, a part (or width) of the second bank 43 positioned between second openings OA2 (or first electrodes 30) neighboring in the second direction is formed to be narrower than a part (or width) of the second bank 43 positioned between second openings OA2 (or first electrodes 30) neighboring in the first direction.

Specifically, a part of the second bank 43 positioned between second openings OA2 neighboring in the first direction is formed to have a predetermined first width W1 such that organic light-emitting materials IM1 and IM2 in different colors dropped to the second openings OA2 neighboring in the first direction are not mixed. It is desirable to set the predetermined first width W1 in the range of 5 to 20 μm, but the present disclosure is not limited thereto. In this case, the organic light-emitting materials IM1 and IM2 in different colors dropped to the second openings OA2 neighboring in the first direction are not mixed. That is, the organic light-emitting materials IM1 and IM2 in different colors dropped to the second openings OA2 neighboring in the first direction are physically separated by the second bank 43. When a subsequent hardening process is performed, the hardened organic light-emitting materials IM1 and IM2 remain in the second openings OA2 neighboring in the first direction to form organic emission layers 50.

In addition, a part of the second bank 43 positioned between a second opening OA2 and a third opening OA3 neighboring in the second direction is formed to have a predetermined second width W2 such that organic light-emitting materials IM1 and IM2 in the same color dropped to the second opening OA2 and the third opening OA3 neighboring in the second direction are mixed. The predetermined second width W2 be less than the first width W1. It is desirable that the predetermined second width W2 be set in the range of 1 to 10 μm, but the present disclosure is not limited thereto. In this case, the organic light-emitting materials IM1 and IM2 of the same color dropped to the second opening OA2 and the third opening OA3 neighboring in the second direction can be mixed and spread to a uniform thickness in a wider area. Organic light-emitting materials IM1 of the same color may be dropped to a plurality of second openings OA2 and third openings OA3 sequentially alternately arranged in the second direction and mixed to be uniformly spread to a uniform thickness in a wider area as necessary. When a subsequent hardening process is performed, the hardened organic light-emitting materials IM1 remain in the second opening OA2 and the third opening OA3 neighboring in the second direction to form organic emission layers 50.

That is, the dropped organic light-emitting materials in the same color can be mixed, reduced in volume through the subsequent hardening process to be separated from each other and respectively remain in the second opening OA2 and the third opening OA3, as shown. Here, parts of the organic light-emitting materials IM1 and IM2 in the same color may be present as remains of mixing on the part of the second bank 43 positioned between the second opening OA2 and the third opening OA3 neighboring in the second direction. The organic light-emitting materials IM1 and IM2 remaining on the second bank 43 do not contribute to light emission and thus do not affect the display quality of the display device.

Accordingly, the present disclosure can secure thickness uniformity of the organic emission layers 50 by selectively dropping an organic light-emitting material IM in third openings OA3 in a predetermined area that is necessary for processes. Therefore, the present disclosure can considerably improve display quality deterioration caused by a thickness deviation of the organic emission layers 50 according to positions. In addition, it is possible to prevent a decrease in the lifespans of elements and generation of dark spots by securing uniformity of the organic emission layers 50.

Figure 8A:
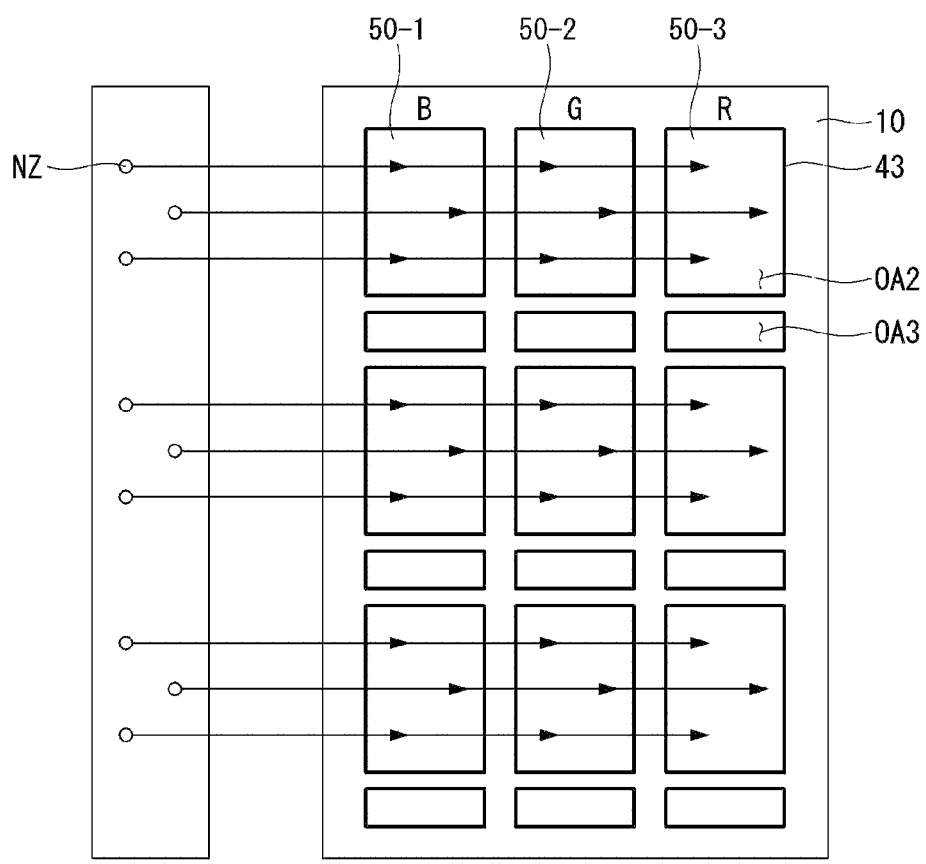
FIGS. 8A to 8C are schematic views for describing applications of the present disclosure and effects according thereto.
Figure 8B:
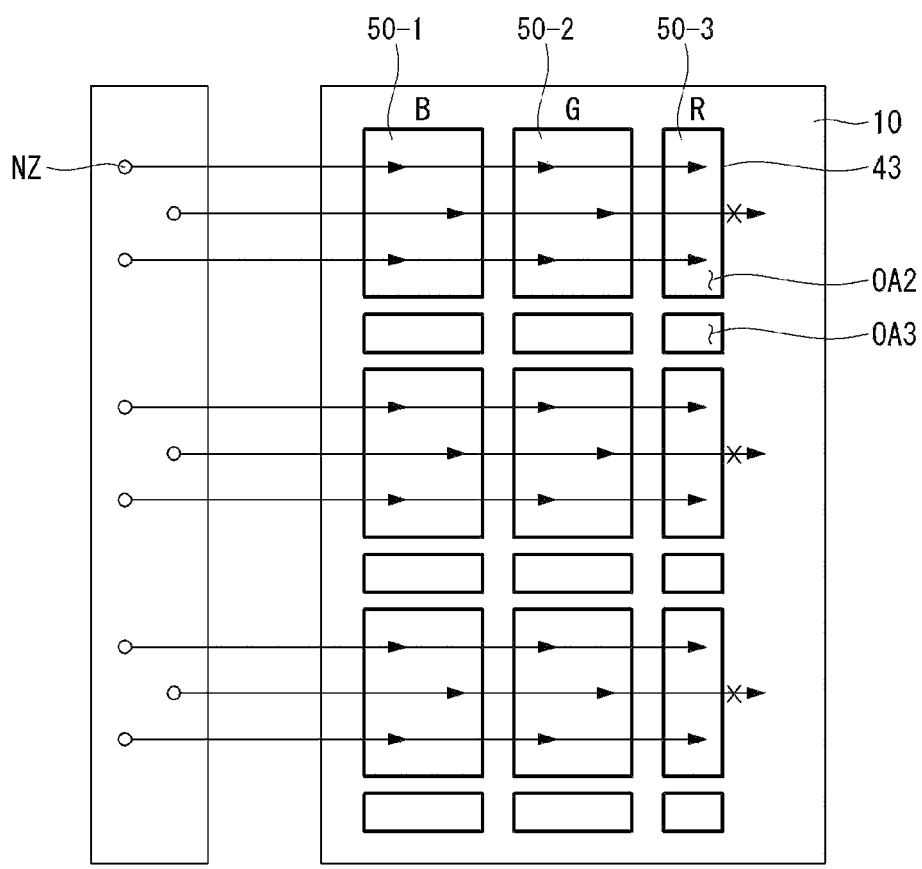
Figure 8C:
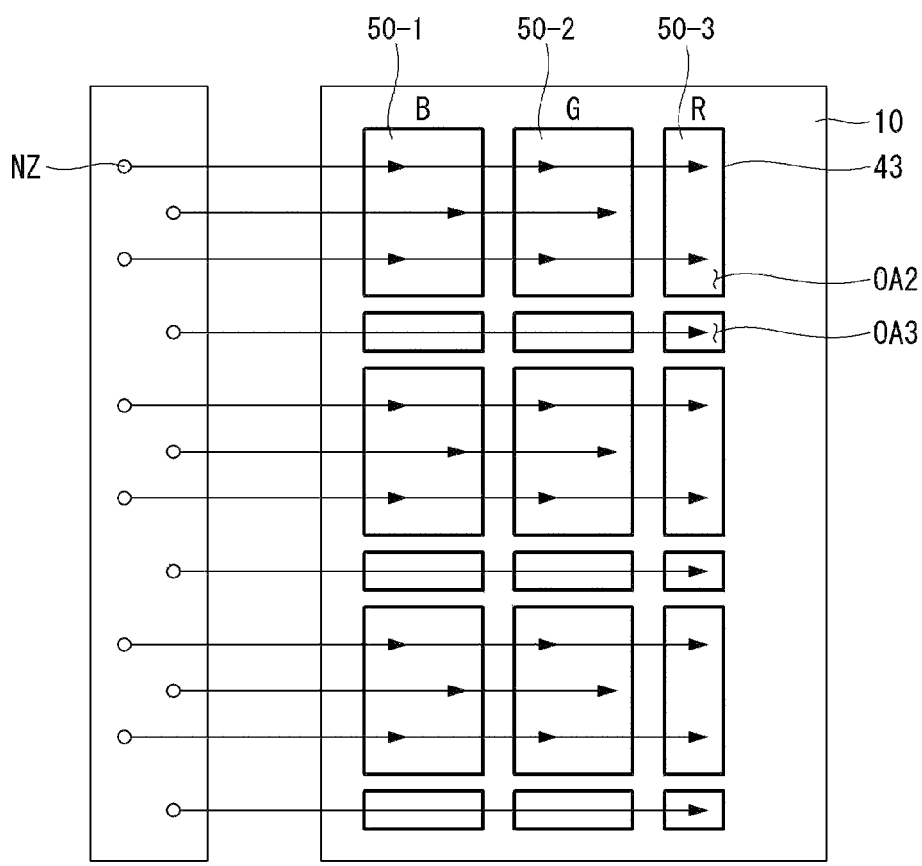

FIGS. 8A to 8C are schematic views for describing applications of the present disclosure and effects according thereto.

Referring to FIG. 8A, discharge rates of nozzles NZ used to drop organic light-emitting materials to the second openings OA2 are not uniform, and thus thicknesses of organic light-emitting materials dropped through the nozzles NZ do not meet a predetermined thickness. To compensate for this, a plurality of nozzles NZ needs to be allocated to one second opening OA2. That is, there may be a thickness deviation in organic light-emitting materials dropped to the second openings OA2 due to a discharge rate deviation in the nozzles NZ when one nozzle NZ is allocated per second opening OA2, whereas the discharge rate deviation in the nozzles NZ is compensated and thus the organic light-emitting materials dropped to the second openings OA2 can have a uniform thickness when a plurality of nozzles NZ is allocated per second opening OA2.

However, a first organic emission layer 50-1 emitting light in a first color, a second organic emission layer 50-2 emitting light in a second color and a third organic emission layer 50-3 emitting light in a third color may occupy different areas, as shown in FIG. 8B. That is, the area of one of the first to third organic emission layers 50-1, 50-2 and 50-3 may differ from that of another one in consideration of the lifespans of selected organic light-emitting materials. In other words, one of a second opening OA2 in which the first organic emission layer 50-1 is formed, a second opening OA2 in which the second organic emission layer 50-2 is formed, and a second opening OA2 in which the third organic emission layer 50-3 is formed may have an area different from another one.

In the following, a case in which the first color is blue, the second color is green, the third color is red, and the area of the third organic emission layer 50-3 emitting light in the third color is smaller than those of the first and second organic emission layers 50-1 and 50-2 emitting lights in the first color and the second color will be described as an example for convenience. In other words, a case in which the area of the second opening OA2 in which the third organic emission layer 50-3 is formed is smaller than those of the second openings OA2 in which the first and second organic emission layers 50-1 and 50-2 are formed will be described as an example.

Since the third organic emission layer 50-3 occupies a small area, it is difficult to allocate a plurality of necessary nozzles NZ to one second opening OA2 in which the third organic emission layer 50-3 is formed. In this case, it is difficult to compensate for a discharge rate deviation in the nozzles NZ within the second opening OA2 and thus the third organic emission layer 50-3 is formed to different thicknesses according to positions which becomes a problem.

To solve this problem, the present disclosure drops an organic light-emitting material in the third color to the second openings OA2 and third openings OA3 neighboring the second openings OA2 in the second direction, as shown in FIG. 8C. The number of nozzles NZ allocated to the second openings OA2 and the third openings OA3 may be selected in consideration of the number of nozzles NZ necessary to compensate for a discharge rate deviation in the nozzles NZ, and a nozzle discharge rate capable of securing a predetermined thickness of the third organic emission layer 50-3. In this case, the organic light-emitting materials in the third color dropped to the second openings OA2 and the third openings OA3 can come into contact with each other according to cohesive force to be mixed and thus can uniformly spread in a wider area to compensate for a thickness deviation according to position. Thereafter, the organic light-emitting material coated to a uniform thickness can remain in the second openings OA2 and the third openings OA3 through a hardening process to form the third organic emission layer 50-3.

Figure 9:
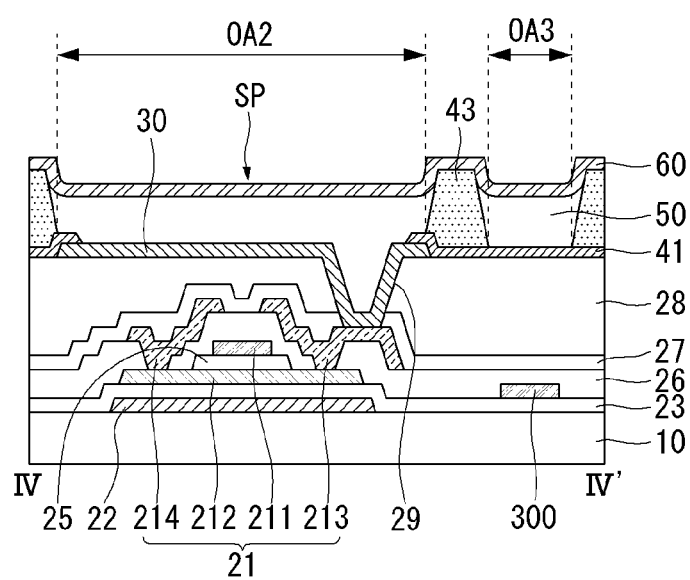
FIG. 9 is a cross-sectional view taken along line IV-IV' of FIG. 2.

FIG. 9 is a cross-sectional view taken along line IV-IV' of FIG. 2.

Referring to FIG. 9, the circuit element layer 20 may include a transistor 21 electrically connected to an OLED. For example, a light shielding layer 22 is disposed on the substrate 10. The light shielding layer 22 serves to block external light to prevent generation of photo current in the transistor. A buffer layer 23 is disposed on the light shielding layer 22. The buffer layer 23 serves to protect the transistor formed in a subsequent process from particles such as alkali ions leaking from the light shielding layer 22. The buffer layer 23 may be formed of a silicon oxide (SiOx), a silicon nitride (SiNx) or a multi-layer thereof.

A semiconductor layer 212 of the transistor is disposed on the buffer layer 23 and a capacitor lower electrode 24 is disposed separately from the semiconductor layer 212. The semiconductor layer 212 and the capacitor lower electrode 24 may be formed of silicon semiconductor or an oxide semiconductor. The silicon semiconductor may include amorphous silicon or crystalized polysilicon. The semiconductor layer 212 includes drain and source regions containing a p-type or n-type impurity, and a channel interposed therebetween. The capacitor lower electrode 24 may also be doped with impurities to be conductive.

A gate insulating layer 25 is disposed on the semiconductor layer 212 and the capacitor lower electrode 24. The gate insulating layer 25 may be formed of a silicon oxide (SiOx), a silicon nitride (SiNx) or a multi-layer thereof. A gate electrode 211 is disposed on a region of the gate insulating layer 25 which corresponds to a predetermined region of the semiconductor layer 212, that is, the channel when impurities have been injected. The gate electrode 211 is formed of one selected from a group consisting of molybdenum (Mo), aluminum (Al), chrome (Cr), gold (Au), titanium (Ti), nickel (Ni), neodymium (Nd) and copper (Cu), or an alloy thereof. Further, the gate electrode 211 may be a multi-layer formed of elements selected from a group consisting of molybdenum (Mo), aluminum (Al), chrome (Cr), gold (Au), titanium (Ti), nickel (Ni), neodymium (Nd) and copper (Cu), or alloys thereof. For example, the gate electrode 211 may be a double layer of molybdenum/aluminum-neodymium or molybdenum/aluminum.

An interlevel insulating layer 26 for insulating the gate electrode 211 is disposed on the gate electrode 211. The interlevel insulating layer 26 may be formed of a silicon oxide (SiOx), a silicon nitride (SiNx) or a multi-layer thereof. A source electrode 213 and a drain electrode 214 are disposed on the interlevel insulating layer 26. The source electrode 213 and the drain electrode 214 are connected to the semiconductor layer 212 through contact holes that expose the source and drain regions of the semiconductor layer 212. The source electrode 213 and the drain electrode 214 may be formed from a single layer or multi-layer. When the source electrode 213 and the drain electrode 214 are formed from a single layer, they may be formed of one selected from a group consisting of molybdenum (Mo), aluminum (Al), chrome (Cr), gold (Au), titanium (Ti), nickel (Ni), neodymium (Nd) and copper (Cu), or an alloy thereof. Further, when the source electrode 213 and the drain electrode 214 are formed from a multi-layer, they may be formed from a double layer of molybdenum/aluminum-neodymium or a triple-layer of titanium/aluminum/titanium, molybdenum/aluminum/molybdenum or molybdenum/aluminum-neodymium/molybdenum. Accordingly, the transistor 21 including the semiconductor layer 212, the gate electrode 211, the source electrode 213 and the drain electrode 214 is formed. Further, the capacitor lower electrode 24 constitutes a capacitor Cst along with the drain electrode 214 serving as a capacitor upper electrode.

A passivation layer 27 is disposed on the substrate 10 including the transistor 21 and the capacitor Cst. The passivation layer 27 is an insulating layer for protecting elements disposed thereunder and may be formed of a silicon oxide (SiOx), a silicon nitride (SiNx) or a multi-layer thereof. An overcoat layer 28 is disposed on the passivation layer 27. The overcoat layer 28 may be a planarization layer for planarizing an uneven surface of the structure disposed thereunder and is made of an organic material such as polyimide, benzocyclobutene series resin or acrylate. The overcoat layer 28 includes a sub-pixel contact hole 29 for exposing the passivation layer 27 to expose the source electrode 213.

An OLED is formed on the overcoat layer 28. The OLED includes the first electrode 30 connected to the transistor, the second electrode 60 opposite the first electrode 30, and the organic emission layer 50 interposed between the first electrode 30 and the second electrode 60. The first electrode 30 may be an anode and the second electrode 60 may be a cathode.

The first electrode 30 may be disposed on the overcoat layer 28 and connected to the source electrode 213 of the transistor through the sub-pixel contact hole 29 penetrating the overcoat layer 28. The first electrode 30 can be allocated per sub-pixel but the present disclosure is not limited thereto. The first electrode 30 may be formed of a transparent conductive material such as indium tin oxide (ITO), indium zinc oxide (IZO) or zinc oxide (ZnO) in response to an adopted emission method to serve as a transparent electrode or may include a reflective layer to serve as a reflective electrode. The reflective layer may be formed of aluminum (Al), copper (Cu), silver (Ag), nickel (Ni) or an alloy thereof. Desirably, the reflective layer may be formed of APC (silver/palladium/copper alloy).

The bank 40 is disposed on the substrate 10 on which the first electrode 30 is formed. The bank 40 includes the first bank 41 and the second bank 43. The first bank 41 and the second bank 43 include openings that expose most of the first electrode.

The organic emission layer 50 is disposed on the substrate 10 on which the bank 40 is formed. The organic emission layer 50 includes an emission layer (EML) and may further include one or more of common layers such as a hole injection layer (HIL), a hole transport layer (HTL), an electron transport layer (ETL) and an electron injection layer (EIL). The bank 40 includes the first bank 41 and the second bank 43.

The second bank 43 includes second openings OA2 that expose the first electrode 30 and third openings OA3 disposed between second openings OA2 neighboring in the second direction.

Transistors 21 allocated to corresponding sub-pixels may be disposed in areas corresponding to the second openings OA2. Signal lines 300 connected to the transistor 21 to apply driving signals to corresponding sub-pixels may be disposed in areas corresponding to the third opening OA3. The signal lines 300 may include gate lines for applying gate signals to sub-pixels, data lines for applying data signals, a high voltage power line for applying a high-voltage power, and a low voltage power line for applying a low-voltage power. When a compensation circuit is applied to sub-pixels as necessary, the signal lines 300 may further include a sensing line for sensing electrical characteristics of the sub-pixels.

Such signal lines 300 may be disposed in areas corresponding to the third openings OA3 and extend across second openings OA2 neighboring in the second direction. In addition, the signal lines 300 may be formed at different levels having one or more insulating layers 23, 26, 27 and 28 interposed therebetween in the areas corresponding to the third openings OA3. For example, the gate lines may be disposed at the same level as the gate electrode 211. The data lines, the high-voltage power line and the low-voltage power line may be disposed at the same level as the source and drain electrodes 213 and 214. The sensing line may be disposed at the same level as the source and drain electrodes 213 and 214 or disposed at the same level as the light shielding layer 22. One of the signal lines 300 may be divided into a plurality of lines disposed at different levels, and the plurality of divided lines may be electrically connected through contact holes penetrating insulating layers disposed therebetween as necessary.

The second electrode 60 is disposed on the organic emission layer 50. The second electrode 60 may be formed on the overall surface of the substrate 10. The second electrode 60 may serve as a transparent electrode or a reflective electrode in response to an adopted emission method. When the second electrode 60 is a transparent electrode, the second electrode 60 may be formed of a transparent conductive material such as ITO or IZO or formed using a thin film of magnesium (Mg), calcium (Ca), aluminum (Al), silver (Ag) or an alloy thereof, which can allow light to pass therethrough. The structure shown in FIG. 9 can be equally applied to other sub-pixels as well as the corresponding sub-pixel.

Figure 10A:
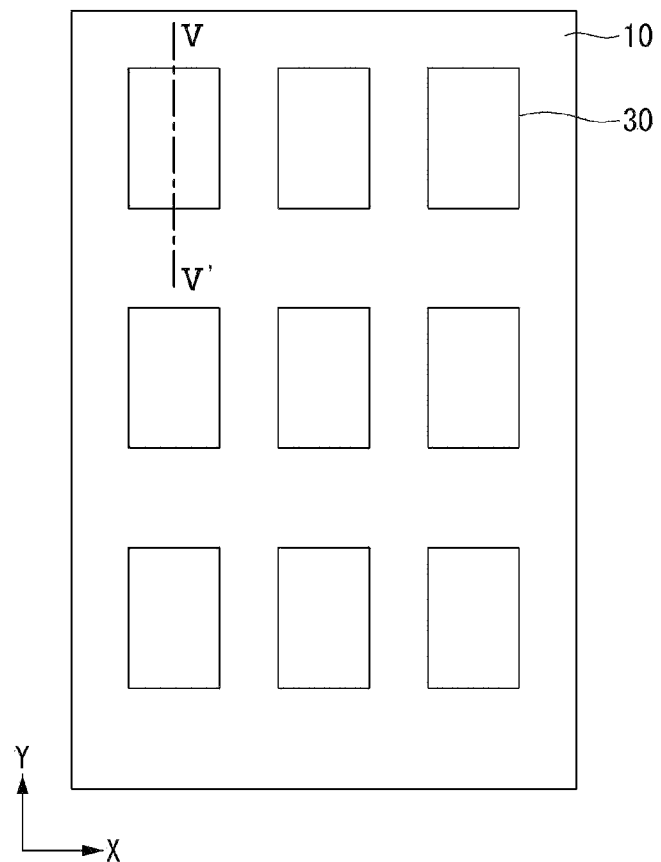
FIGS. 10A to 10C are schematic views for describing processes of forming first electrodes and banks in chronological order.
Figure 10A:
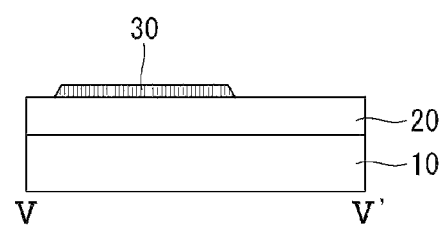
Figure 10B:
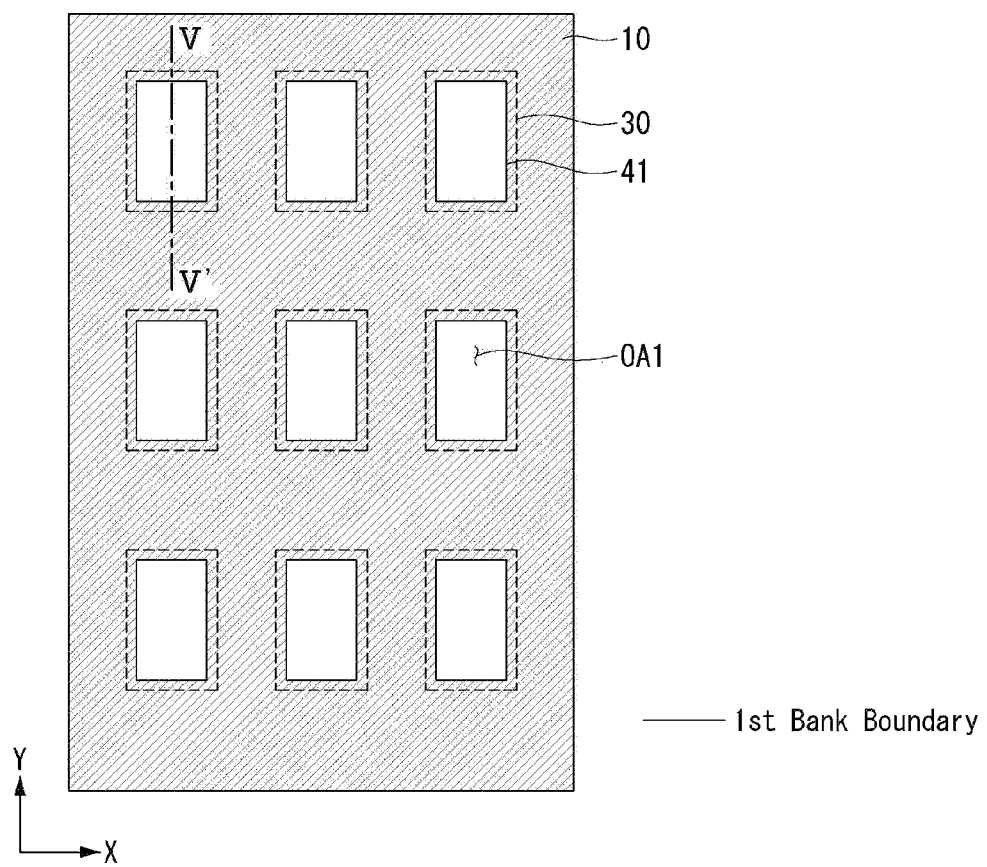
Figure 10B:
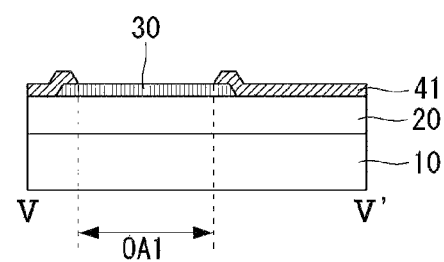
Figure 10C:
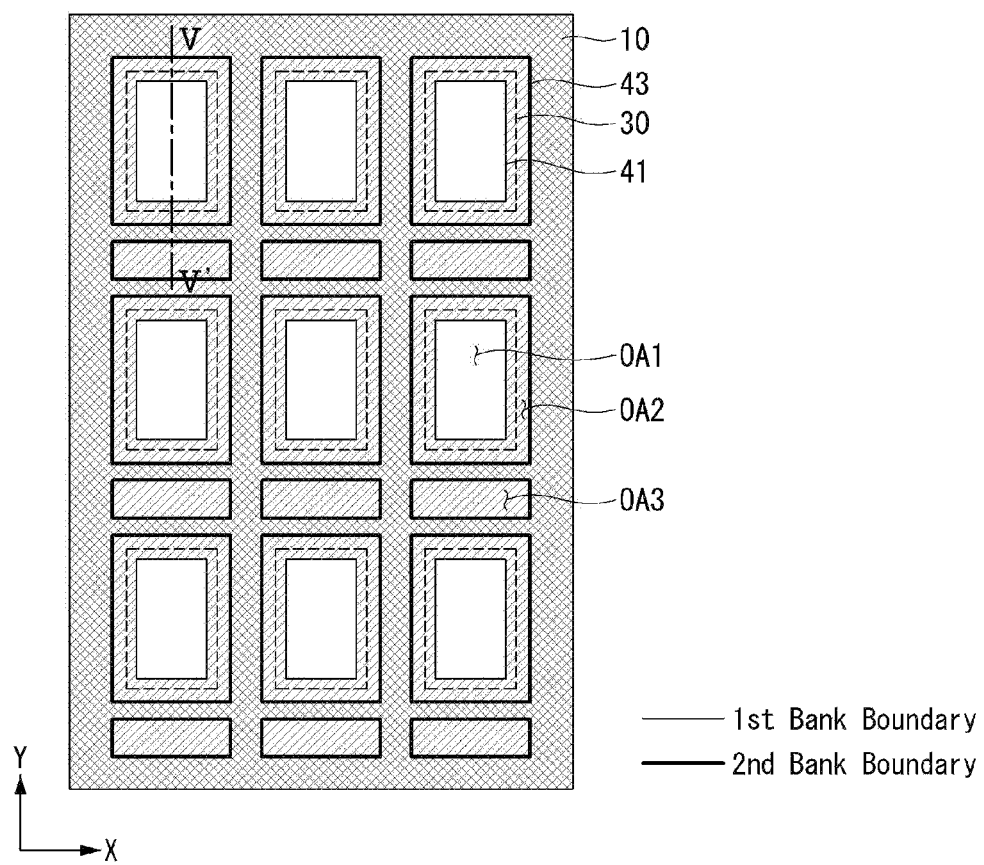
Figure 10C:
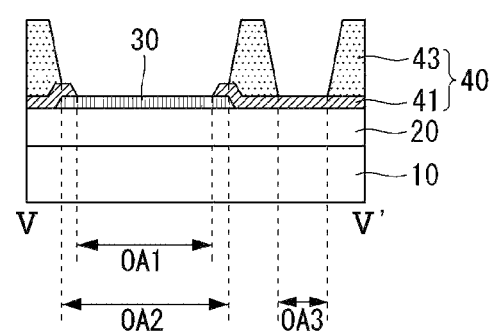

FIGS. 10A to 10C are diagrams for describing processes of forming the first electrodes and banks in chronological order.

Referring to FIG. 10A, the first electrodes 30 are formed on the substrate 10. The first electrodes 30 may be arranged in a matrix form in the first direction and the second direction, but the present disclosure is not limited thereto.

Referring to FIG. 10B, the first bank 41 is formed on the substrate 10 on which the first electrodes 30 are formed. The first bank 41 includes first openings OA1. The first opening OA1 exposes at least parts of the first electrode 30. The first opening OA1 may be formed to completely expose the first electrode 30 as necessary.

Referring to FIG. 10C, the second bank 43 is formed on the substrate 10 on which the first bank 41 is formed. The second bank 43 includes second openings OA2 and third openings OA3.

The second opening OA2 exposes at least parts of the first electrode 30. When the first opening OA1 is formed to completely expose the first electrode 30 as necessary, the second bank 43 may be formed to cover the edges of the first electrode 30 while exposing the centers of the first electrode 30. In this case, the second opening OA2 may have areas narrower than the first opening OA1 and may be disposed within the first opening OA1, differently from the illustrated structure.

The third openings OA3 may be simultaneously formed in a patterning process for forming the second openings OA2. The third openings OA3 are disposed between second openings OA2 neighboring in the second direction in predetermined areas. Although a case in which the third openings OA3 are disposed between second openings OA2 neighboring in the second direction is illustrated as an example in the figure, the present disclosure is not limited thereto. That is, the third openings OA3 may be selectively disposed only in predetermined areas.

A distance between a second opening OA2 and a third opening OA3 neighboring in the second direction is set to be less than a distance between second openings OA2 neighboring in the first direction. In other words, the width of a part of the second bank 43 disposed between a second opening OA2 and a third opening OA3 neighboring in the second direction is set to be less than the width of a part of the second bank 43 disposed between second openings OA2 neighboring in the first direction. Accordingly, organic light-emitting materials dropped to the second opening OA2 and the third opening OA3 neighboring in the second direction can be mixed with each other, whereas organic light-emitting materials dropped to the second openings OA2 neighboring in the first direction may not be mixed because they are separated from each other by a sufficient distance.

Figure 11A:
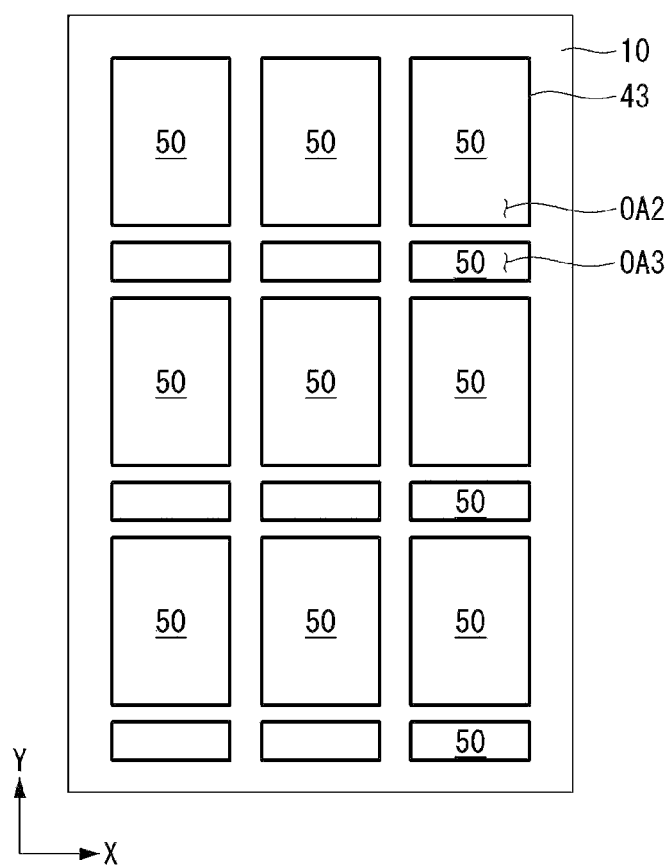
FIGS. 11A to 11C are schematic views showing an organic light emitting display device according to a second aspect of the present disclosure.
Figure 11B:
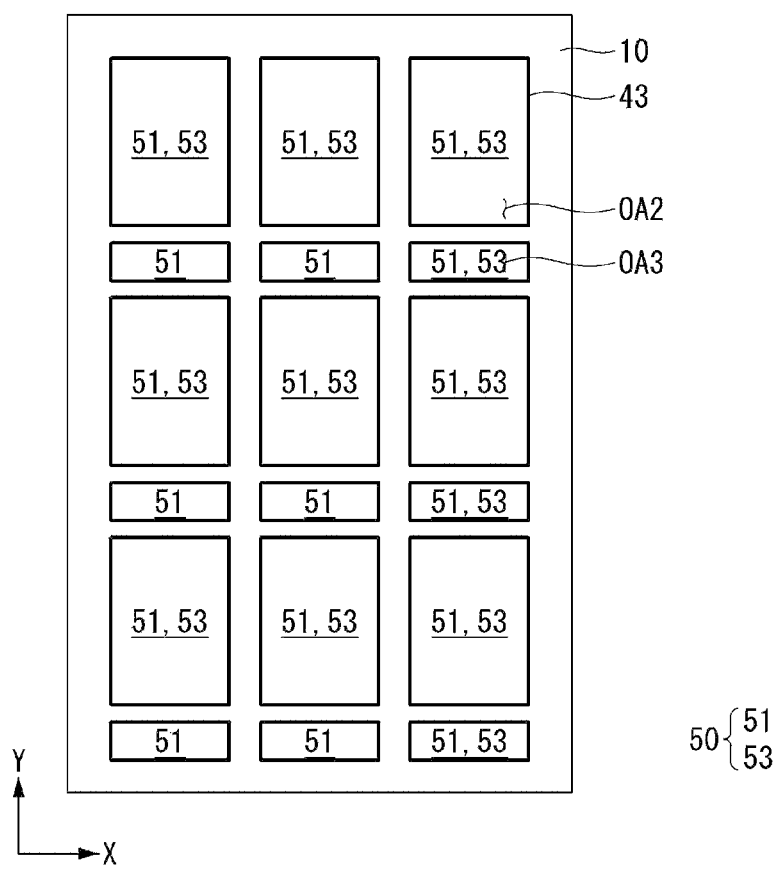
Figure 11C:
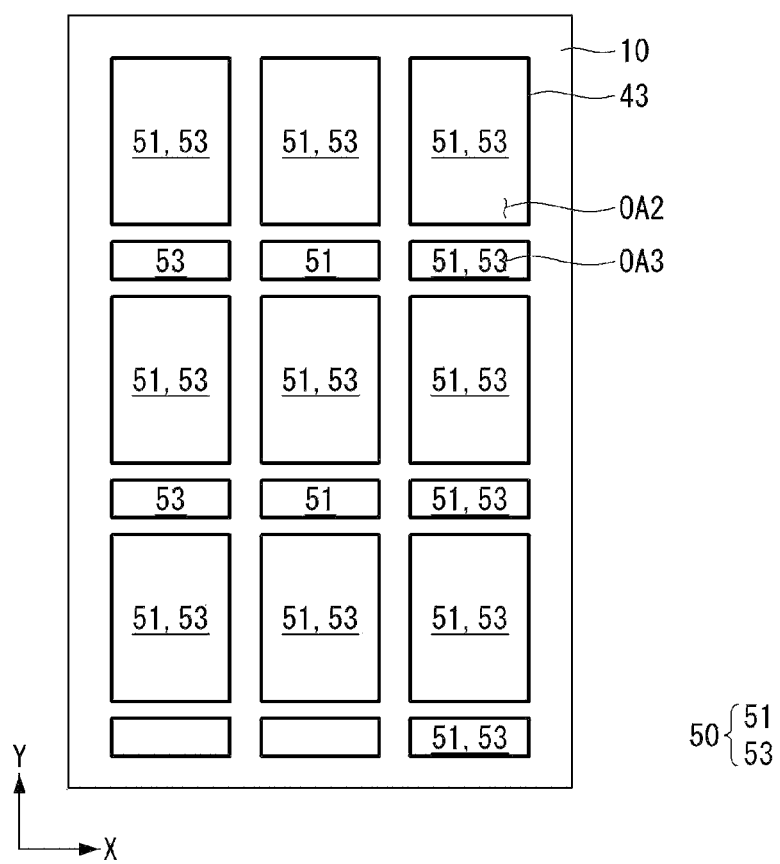

FIGS. 11A to 11C are schematic plan views showing an organic light emitting display device according to a second aspect of the present disclosure. FIGS. 11A to 11C schematically show structures in which only the second bank and organic emission layers are formed for convenience of description. In the following description of the second aspect, substantially the same components as those of the first aspect will be omitted.

Referring to FIG. 11A, the second bank 43 is formed on the substrate 10. The second bank 43 includes second openings OA2 and third opening OA3.

Organic emission layers 50 are formed in the second openings OA2. Each organic emission layer 50 includes an emission layer (EML) and may further include one or more of common layers such as a hole injection layer (HIL), a hole transport layer (HTL), an electron transport layer (ETL) and an electron injection layer (EIL).

Organic emission layers 50 emitting lights in the same color are formed in second openings OA2 neighboring in the first direction. Organic emission layers 50 formed in second openings OA2 neighboring in the first direction can emit lights in the same color. Organic emission layers 50 emitting lights in different colors are formed in second openings OA2 neighboring in the second direction. Organic emission layers 50 formed in second openings OA2 neighboring in the second direction can emit lights in different colors.

Organic emission layers 50 may be selectively formed in the third openings OA3 in predetermined regions. Here, organic emission layers 50 formed in the third openings OA3 contain organic light-emitting materials in the same color as organic emission layers 50 formed in second openings OA2 neighboring the third openings OA3 in the second direction.

For example, an organic emission layer 50 may be formed in at least one of the third openings OA3 and may not be formed in another one. In this case, third openings OA3 in which the organic emission layer 50 is formed and third openings OA3 in which the organic emission layer 50 is not formed may coexist on the second bank 43 (shown in FIG. 11A).

As another example, a common layer 51 among the organic emission layers 50 may be formed in all of the third openings OA3 and an emission layer 53 among the organic emission layers 50 may be selectively formed in some of the third openings OA3. In this case, third openings OA3 in which both the emission layer 53 and the common layer 51 are formed and third openings OA3 in which only the common layer 51 is formed may coexist on the second bank 43 (shown in FIG. 11B).

As another example, the common layer 51 among the organic emission layers 50 may be selectively formed in some of the third openings OA3 and the emission layer 53 among the organic emission layers 50 may also be selectively formed in some of the third openings OA3. In this case, at least two of (1) third openings OA3 in which both the emission layer 53 and the common layer 51 are formed, (2) third openings OA3 in which both the emission layer 53 and the common layer 51 are not formed, (3) third openings OA3 in which only the emission layer 53 is formed and (4) third openings OA3 in which only the common layer 51 is formed may coexist on the second bank 43 (shown in FIG. 11C).

In this manner, the second aspect of the present disclosure can selectively form the common layer 51 and/or the emission layer 53 only in third openings OA3 disposed in predetermined regions among the third openings OA3 in consideration of the above-described effects of the present disclosure. Accordingly, the second aspect of the present disclosure can provide an organic light emitting display device with a considerably improved degree of freedom in design.

Those skilled in the art will appreciate that various modifications and variations can be made in the present disclosure without departing from the spirit or scope of the disclosure through the above description. Accordingly, the technical scope of the present disclosure should not be limited to the detailed description of the specification but should be determined by the claims.

What is claimed is:
1. An organic light emitting display device comprising:
a substrate having a plurality of sub-pixels arranged in a first direction and a second direction intersecting the first direction;
a plurality of first electrodes disposed to correspond to the plurality of sub-pixels;
a first bank having a plurality of first openings exposing a portion of the plurality of first electrodes; and a second bank disposed on the first bank, having a plurality of second openings that exposes the plurality of first electrodes, and at least one third opening disposed between two neighboring second openings along the second direction.

2. The organic light emitting display device of claim 1, wherein a width of the second bank disposed between neighboring second and third opening in the second direction is less than that of the second bank disposed between the two neighboring second openings in the first direction.

3. The organic light emitting display device of claim 2, further comprising an organic emission layers disposed in at least one of the plurality of second openings and the at least one third opening.

4. The organic light emitting display device of claim 3, wherein the organic emission layers disposed in neighboring second and third openings in the second direction includes organic light-emitting materials emitting light with a same color.

5. The organic light emitting display device of claim 3, wherein the organic emission layers disposed in two neighboring second openings in the first direction includes organic light-emitting materials emitting light with different colors.

6. The organic light emitting display device of claim 3, wherein the organic emission layers include:
a an emission layer; and
a common layer having one or more of a hole injection layer (HIL), a hole transport layer (HTL), an electron transport layer (ETL) and an electron injection layer (EIL),
wherein the second bank has at least two of the third openings in which both the emission layer and the common layer are formed, the third opening in which both the emission layer and the common layer are not formed, the third opening in which only the emission layer is formed, and the third opening in which only the common layer is formed.

7. The organic light emitting display device of claim 2, further comprising:
a first organic emission layer having a first color and disposed in each of the second openings and the third openings arranged in a first column extending in the second direction; and
a second organic emission layer having a second color and disposed in each of the second openings arranged in a second column extending in the second direction,
wherein the second organic emission layer is not disposed in the third openings arranged in the second column.

8. The organic light emitting display device of claim 2, further comprising:
a first organic emission layer having a first color and disposed in each of the second openings arranged in the first column extending in the second direction; and
a second organic emission layer having a second color and disposed in each of the second openings arranged in the second column extending in the second direction,
wherein the first organic emission layer is disposed in some of the third openings arranged in the first column, and the second organic emission layer is not disposed in the third openings arranged in the second column.

9. The organic light emitting display device of claim 7, wherein an area of each second opening in the first column is less than that of each third opening in the second column.

10. The organic light emitting display device of claim 1, wherein the at least one third opening exposes the first bank.

11. The organic light emitting display device of claim 1, wherein the plurality of second openings is an emission region and the plurality of third openings is a non-emission region.

12. The organic light emitting display device of claim 1, wherein the plurality of second openings exposes the plurality of first openings.

13. The organic light emitting display device of claim 1, wherein each second opening has an area narrower than each first opening and is disposed within the first opening.

14. The organic light emitting display device of claim 1, wherein the first bank has hydrophilicity and the second bank has hydrophobicity.

15. An organic light emitting display device comprising:
a substrate having a plurality of sub-pixels arranged along a first direction and a second direction intersecting the first direction;
a plurality of first electrodes disposed to correspond to the plurality of sub-pixels;
a first bank having a plurality of first openings exposing a portion of the plurality of first electrodes;
a second bank disposed on the first bank, having a plurality of second openings that exposes the plurality of first electrodes and at least one third opening exposes the first bank and disposed between two neighboring second openings along the second direction; and
an organic emission layers disposed in at least one of the plurality of second openings and the at least one third opening.

16. The organic light emitting display device of claim 15, further comprising:
a first organic emission layer having a first color and disposed in each of the second openings and the third openings arranged in a first column extending in the second direction; and
a second organic emission layer having a second color and disposed in each of the second openings arranged in a second column extending in the second direction,
wherein the second organic emission layer is not disposed in the third openings arranged in the second column.

17. The organic light emitting display device of claim 15, further comprising:
a first organic emission layer having a first color and disposed in each of the second openings arranged in the first column extending in the second direction; and
a second organic emission layer having a second color and disposed in each of the second openings arranged in the second column extending in the second direction,
wherein the first organic emission layer is disposed in some of the third openings arranged in the first column, and the second organic emission layer is not disposed in the third openings arranged in the second column.

18. The organic light emitting display device of claim 15, wherein the plurality of second openings exposes the plurality of first openings.

19. The organic light emitting display device of claim 15, wherein each second opening has an area narrower than each first opening and is disposed within the first opening.

20. The organic light emitting display device of claim 15, wherein the first bank has hydrophilicity and the second bank has hydrophobicity.

* * * * *